United States Patent [19]
Parsons

[11] 4,027,207
[45] May 31, 1977

[54] ELECTRICAL SAFETY BYPASS

[75] Inventor: Charles John Parsons, Endicott, N.Y.

[73] Assignee: International Business Machines Corporation, Armonk, N.Y.

[22] Filed: Nov. 3, 1975

[21] Appl. No.: 628,432

[52] U.S. Cl. .............................. 361/404; 361/433
[51] Int. Cl.² ......................................... H05K 1/04
[58] Field of Search ............ 339/45 R, 45 M, 17 C; 357/68, 69; 200/51.05–51.07; 317/101 CC, 230, 10 R

[56] References Cited

UNITED STATES PATENTS

| | | | |
|---|---|---|---|
| 599,910 | 3/1898 | Lister | 200/51.05 |
| 635,058 | 10/1899 | Phelps | 200/51.07 |
| 3,231,767 | 1/1966 | Powell | 339/32 M |
| 3,579,813 | 5/1971 | Tomiwa | 317/230 |

*Primary Examiner*—David Smith, Jr.
*Attorney, Agent, or Firm*—Norman R. Bardales

[57] ABSTRACT

Two terminals are disposed on the body of an electrical component such that each terminal is adapted to be in contact with an exclusive one of a pair of circuit interconnection terminals whenever the body is oriented in a first direction with respect to the two interconnection terminals. One of the two component terminals is further adapted to be in contact with both circuit interconnection terminals whenever the body is oriented in a second direction with respect to the two interconnection terminals. As such, in the first direction the component is electrically operable in the associated circuit, and in the second direction the component is bypassed.

11 Claims, 6 Drawing Figures

4,027,207

ELECTRICAL SAFETY BYPASS

BACKGROUND OF THE INVENTION

1. Field of the Invention

This invention relates to the interconnection of electrical apparatus and more particularly to the safe interconnection of such apparatus.

2. Description of the Prior Art

It is often desirous to interconnect an electrical component to a circuit so that it has a certain electrical polarity with respect to the circuit. This is particularly true for polarized components such as, for example, certain capacitors, batteries, diodes, rectifiers, PN junctions and the like.

If the components are incorrectly connected, i.e. with the polarity reversed, potential safety hazards may result such as non-operability of the associated circuit and/or damage or destruction of the polarized component and/or the other components of the associated circuit. For example, certain polarized tantalum capacitors, if incorrectly connected, can generate sufficient heat to cause the particular capacitor to burst into flame and as such constitute a potential fire hazard. Moreover, where the polarized component has no way of being discernable, because of their similarity, which of its component terminals are associated with which polarity, and/or where the components are not provided with identifying polarity markings for the terminals and/or where the terminals are incorrectly marked, the hazard potential is further increased.

It should be understood that while there are prior art electrical components which have asymmetrically and symmetrically disposed component terminals, cf. for example, U.S. Pat. Nos. 2,945,163 and 3,444,436, respectively, and prior art foolproof devices for insuring correct polarity connection, cf. for example, U.S. Pat. No. 3,339,169, none of the prior art references or devices of which I am aware, provide a bypass connection between the two circuit interconnection terminals using one of the component terminals as is done in my present invention.

SUMMARY OF THE INVENTION

It is an object of this invention to provide interconnection between two electrical devices such that when the devices are oriented in a first direction with respect to each other they are operably interconnectable by their terminals, but if oriented in another direction, one of the devices will be bypassed through the co-action of one of the terminals of one device and the two terminals of the other device.

Still another object of this invention is to provide electrical safety bypass in association with the interconnection of two electrical devices.

It is another object of this invention to provide the aforesaid interconnection in which one of the two devices is a polarized electrical component.

Another object of this invention is to provide the aforesaid interconnection wherein one of the devices is a polarized capacitor.

Accordingly, one of the features of this invention is to provide electrical apparatus which includes first and second electrical devices. A pair of first and second terminal means are disposed on the first device and likewise a pair of third and fourth terminal means are disposed on the second device. When the first device is oriented in a predetermined first direction relative to the second device, the first and second terminal means are adapted to be in contacting relationship with the third and fourth terminal means, respectively. However, when the first device is oriented in a predetermined second direction relative to the second device, the first terminal means is adapted to be in contacting relationship with the third and fourth terminal means.

According to another feature of the present invention, there is provided a method of protecting electrical apparatus having a pair of first and second interconnecting terminals and at least one polarized component with positive and negative terminals. The method comprises the steps of electrically connecting the positive and negative terminals to the first and second interconnection terminals, respectively, on a mutually exclusive basis whenever the component is oriented in a first direction, and electrically connecting at least one of the positive and negative terminals to both the first and second interconnection terminals whenever the component is oriented in a second direction.

The foregoing and other objects, features and advantages of the invention will be apparent from the following more particular description of the preferred embodiment of the invention, as illustrated in the accompanying drawing.

BRIEF DESCRIPTION OF THE DRAWING

In the Figures, like elements are designated with similar reference numerals.

DESCRIPTION OF THE PREFERRED EMBODIMENT

Figure 1:
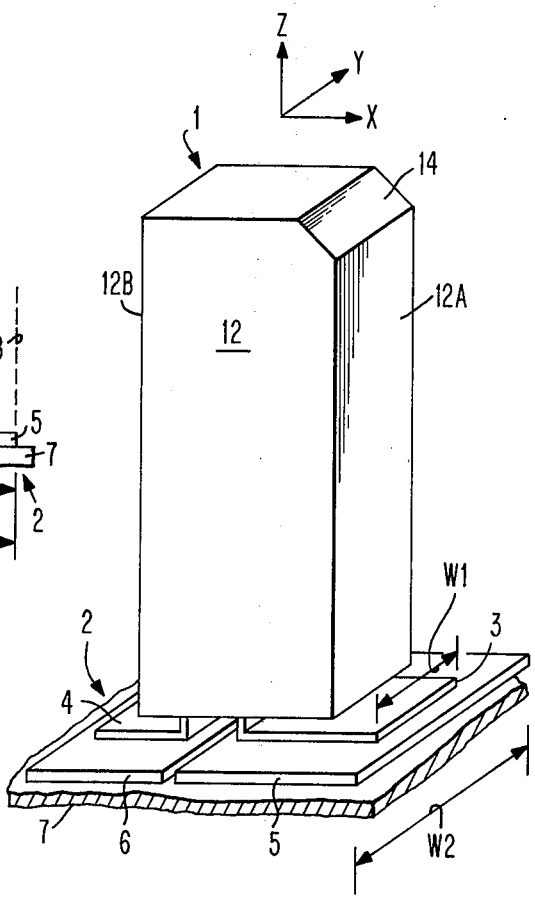
FIG. 1 is a perspective view of a preferred embodiment of the present invention.
Figure 2:
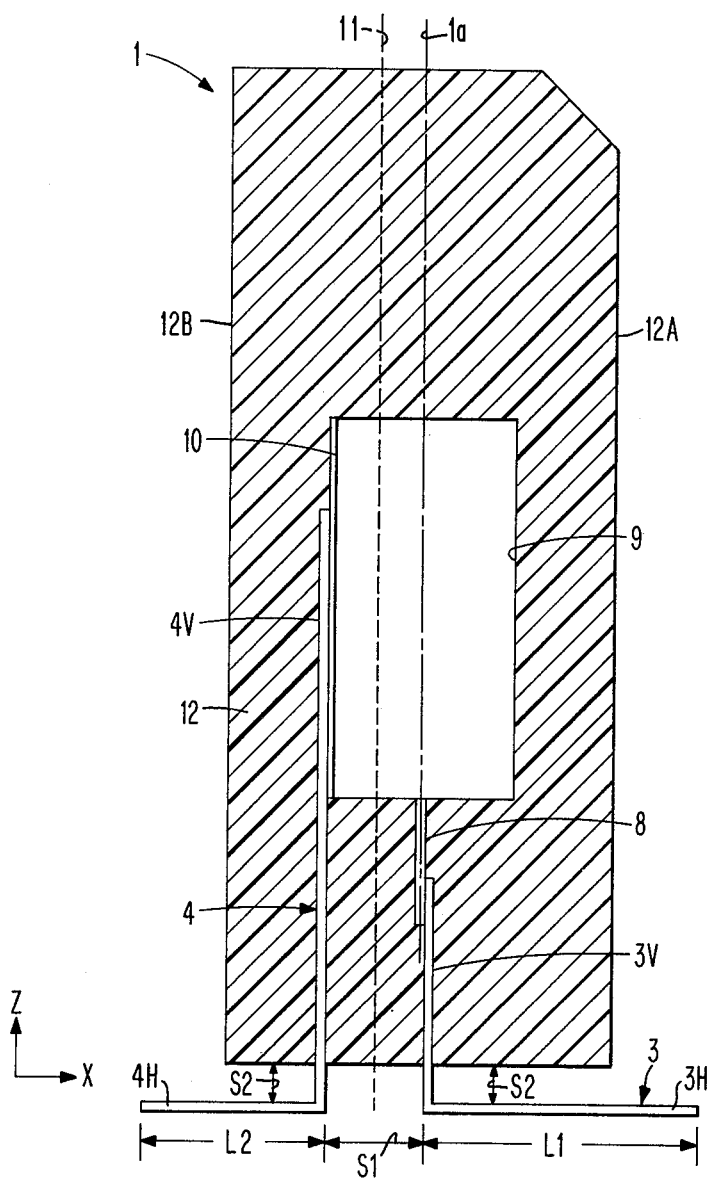
FIG. 2 is an enlarged front elevation view, shown partially in a cross-section, of one of the devices of FIG. 1.
Figure 3:
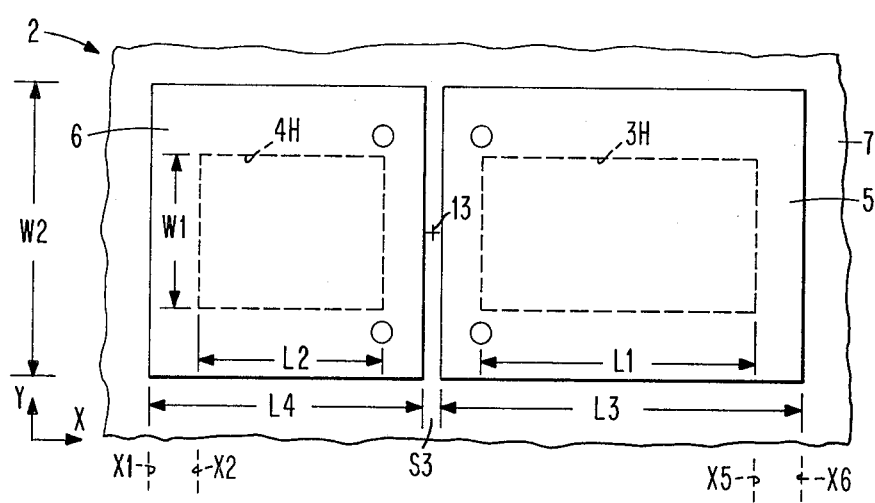
FIG. 3 is a plan view of the other device of FIG. 1.

Referring to FIGS. 1-3, the preferred embodiment is shown as comprising two electrical devices 1, 2. More particularly, in the preferred embodiment device 1 is a polarized tantulum capacitor component and device 2 is a printed circuit board or the like to which it is to be interconnected. Disposed on device 1 is a pair of terminals 3, 4. Disposed on device 2 is a pair of terminals 5, 6 which in the preferred embodiment are a pair of conductive pads formed on a multilayer printed circuit board substrate 7, partially shown for sake of clarity, in a manner well known to those skilled in the art.

Referring now to FIGS. 1 and 2 in greater detail, terminals 3 − 4 in the preferred embodiment are formed from conductive flat plate stock and are configured into L-shapes. Terminals 3 and 4 have the same uniform cross-sectional widths W1, which are parallel to the Y axis. An upper portion of the vertical part 3V of the L-shaped terminal 3 is connected, e.g. by a weld bond, to the axial wire lead 8 which extends into the tantalum electrolytic member 9 along the central axis 1a. Lead 8 is the anode or positive electrode of the polarized capacitor. An upper portion of the upright part 4V of terminal 4 is connected to the outer face of mamber 9. By way of example, for this purpose, member 9 has a rectangular cross-section which is normal to and symmetrically disposed about central axis 1a. Terminal 4 is solder bonded to a thin conductive layer 10 which is affixed to an appropriate face of member 9, which is parallel to the YZ plane, cf. FIGS. 1, 2. Layer 10 is part of the cathode or negative electrode of the polarized capacitor.

The terminals 3, 4 are affixed to respective lead 8 and layer 10 such that their respective upright parts 3V, 4V are substantially in an aligned relationship and parallel with the YZ plane, and their respective co-planar horizontal parts 3H, 4H extend outwardly in an aligned relationship parallel with the XY plane and away from the line 11. Line 11 is offset from center axis 1a of device 1 and intersects the central point of the rectangular spacing formed in the XY plane located between parts 3V, 4V, which are spaced at a distance S1. Members 8 to 10 and a substantial part of each of the upright parts 3V, 4V are encapsulated by, for example, a molding process in a solid epoxy insulator case or block 12, shown in cross-section for sake of clarity, and together therewith form a composite body for device 1. The block 12 preferably has a rectangular cross-section in the XY plane, which is concentric and compatibly contoured with the aforementioned rectangular cross-section of member 9. As such, block 12 is thus symmetrically disposed about center axis 1a and its opposite end faces 12A, 12B are parallel to the YZ plane. A predetermined clearance S2 is provided between the bottom of block 12 and each of the horizontal parts 3H, 4H of the L-shaped terminals 3, 4.

As shown in FIG. 3, the terminals 5, 6 of the other device 2 in the preferred embodiment are configured as aligned rectangular printed circuit line contact pads on the substrate 7. Terminals 5, 6 have the same width W2 and are separated by a predetermined distance S3. Each pad 5, 6 is adapted to be joined to one or more printed circuit lines of the circuit board that are extended from one or more appropriate sides of the particular pad and/or to one or more via, i.e. plated through, holes of the board and/or to one or more discrete wire conductors affixed to the outer surface of the particular pad. For sake of clarity, the lastmentioned other printed circuit lines, via holes and wire conductors are omitted in the drawing, for sake of clarity.

For the particular embodiment, it is assumed for purposes of explanation that positive and negative voltages are to be applied to terminals 5 and 6, respectively, when the devices 1 and 2 are subsequently installed in the system, not shown, with which they will be used. Shown in FIG. 3 in outline form, for sake of clarity, are the positions of the respective horizontal parts 3H, 4H of terminals 3, 4 as they would be mounted on terminals 5, 6 so that the component or device 1 is correctly polarized when the assembled devices 1 and 2 are subsequently installed in the aforementioned system. In FIG. 3, the terminals 3, 4 are shown idealistically and desirably as being symmetrically disposed in the X and Y directions about the mid-point or center 13 of the rectangular spacing formed in the XY plane between the two respective facing edges or sides of terminals 5, 6, and such that the extended center line 11 of device 1 intersects the mid-point 13. In practice, however, within certain tolerances the terminals 3, 4 may be asymmetrically disposed in the X and/or Y directions while still being maintained in the mutually exclusive contacting relationship of terminals 3 and 4 with terminals 5 and 6, respectively, as is apparent to those skilled in the art.

Figure 4:
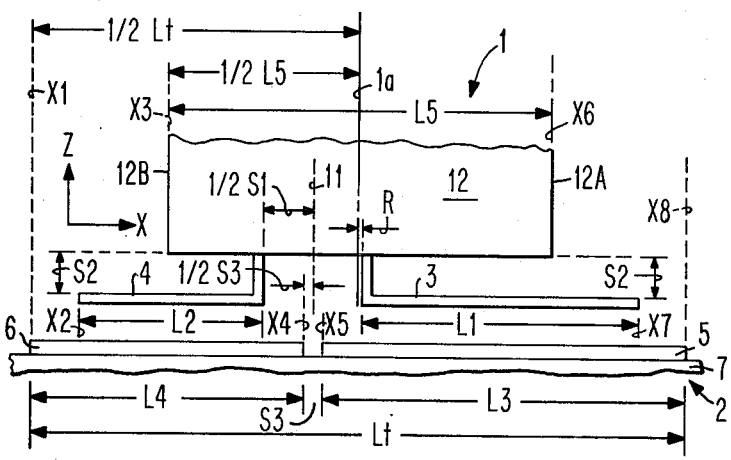
FIGS. 4 and 5 are exploded partial front elevation views illustrating the device of FIG. 2 in first and second positions, respectively, relative to the device of FIG. 3.
Figure 5:
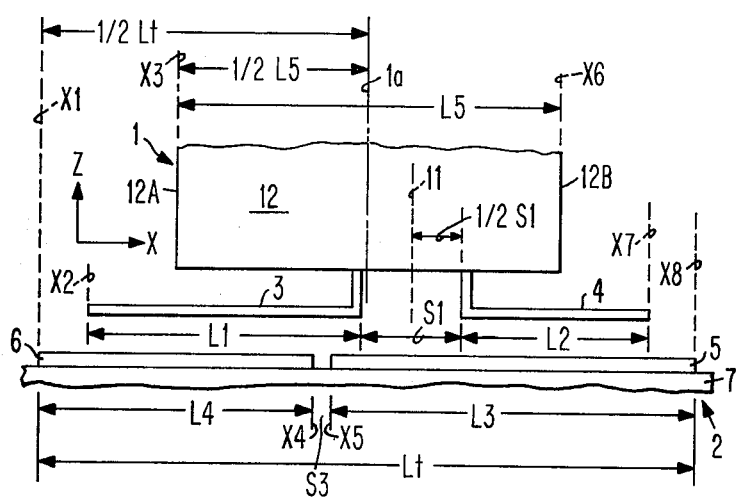

In accordance with the principles of the present invention, when device 1 is oriented in one direction relative to device 2, terminals 3 and 4 are adapted to be in contacting relationship with the terminals 5 and 6, respectively, of. FIGS. 3, 4, for example; whereas, when device 1 is oriented in another direction relative to device 2, terminal 3 is adapted to be in contacting relationship with terminals 5 and 6, cf. FIG. 5, for example. In the preferred embodiment the two directions are preferably substantially reverse with respect to each other. In FIGS. 3, 4, the terminals 3 and 4, and hence the orientation of device 1, relative to terminals 5 and 6, and hence to device 2, are thus illustrated in an arbitrarily referred to zero degree direction which is parallel to the XY plane. In FIG. 5, terminals 3 and 4 are illustrated relative to terminals 5 and 6 in the opposite or reverse direction which is also parallel to the XY plane but is one hundred eighty degrees from the direction shown in FIGS. 3, 4. As is apparent to those skilled in the art, the terminals 3, 4 may be skewed in the XY plane within certain tolerances from either of these directions while still being maintained in the particular respective aforementioned contacting relationship with terminals 5, 6 that are associated with the particular direction from which terminals 3, 4 are skewed. It should be understood that FIGS. 4 and 5 are illustrated as exploded views for sake of clarity and that the terminals 3, 4 of device 1 are in the respective aforedescribed contacting relationships with terminals 5, 6.

Thus, when device 1 is mounted to device 2 with terminals 3 and 4 connected, e.g. by a solder bond or the like to terminals 5 and 6, respectively, as shown in FIG. 4, the component 9 of device 1 is properly polarized when the interconnected assembled devices 1, 2 are subsequently installed in the aforementioned system. However, should device 1 be inadvertently mounted to device 2 with terminal 3 connected to terminals 5 and 6, as shown in FIG. 5, the polarized component is bypassed, i.e. electrically short circuited, by the terminal 3. As a result, the component 9 of device 1 is prevented from being electrically connected into the system. Terminal 3 thus acts as a safety bypass in the preferred embodiment. Furthermore, in the case where device 1 is a tantalum capacitor, the short circuit connection of terminal 3 prevents the accidental application of a reverse polarity across the capacitor. Thus, the potential danger or hazard of accidental combustion resulting from the application of such a reverse polarity to the capacitor is substantially mitigated by the bypass terminal 3.

The contacting relationships are provided by differently offsetting at least one of the terminals 3, 4 from a predetermined axis of device 1. The axis is preferably an axis of symmetry of device 1 and in the preferred embodiment shown in FIGS. 1 – 5 is the center axis 1a. However, it should be understood that the invention can be practiced using another axis such as, for example, an axis that is offset from the axis of symmetry as is apparent to those skilled in the art. As shown in the preferred embodiment, terminal 3 extends from substantially the midpoint or center between end faces 12A, 12B, whereas terminal 4 extends between the terminal 3 and end face 12B.

Thus, in the preferred embodiment, the parameters S1 and S3 and different offset relationships for each of the parts 3V, 4V from the center axis 1a are judiciously selected to effect the aforedescribed contacting relationships. As shown in FIG. 4, S1 is greater than S3, part 3V is offset from axis 1a by a value R which is substantially equal to the radius of the wire lead 8 shown in FIG. 2, and part 4V is offset from axis 1a by a value substantially equal to the distance S1 minus R, the thickness of layer 10 being negligible. If the radius of wire 8 is also negligible with respect to S1, then the offset values of parts 3V and 4V are substantially zero and S1, respectively. Preferably, the part 3V may be provided with a substantially zero offset from the center axis 1a by bending it slightly so that it is coincidently aligned with the center axis 1a.

Morover, the length parameter L1 of part 3H is preferably made longer than the corresponding parameter L2 of part 4H, and both parts 3H and 4H extend outwardly past the sides of block 12 in the X direction. However, the parameter L1 need only be sufficiently long to bridge the gap or spacing S3 so as to be in contacting relationship with terminals 5 and 6 should the device 1 be positioned in the aforedescribed reverse direction associated with FIG. 5. Thus, as is apparent to those skilled in the art, parameters L1 and L2 may be equal, or L2 greater than L1, and/or one or both of the parts 3H, 4H need not be extended past the sides of block 2. The respective length and width parameters L3, L4 and W2 of terminals 5 and 6 are generally selected to be greater than the corresponding respective parameters L1, L2, W1 of terminals 3 and 4 for case of mounting the device 1 to device 2.

For sake of explanation, certain X location coordinates of the printed circuit board device 2 ares shown in FIGS. 4 and 5. Thus, the remote sides or ends of terminals 6 and 5 of device 2 are located at locations X1 and X8, respectively, and the facing ends are located at terminals X4 and X5, respectively. The distance Lt between coordinates X1 and X8 is the sum of lengths L3, L4 and spacing S3. The spacing S3 is offset from the midpoint of distance Lt. In the preferred embodiment, device 1 is symmetrically mounted about the midpoint of Lt. Thus, the axis 1a of symmetry of device 1, when mounted to device 2, is located at an X location which is a distance ½ Lt from each of the coordinates X1, X8.

In FIG. 4, the remote ends of terminals 4 and 3 of device 1, when mounted to device 2, are located at locations X2 and X7, respectively. The spacing S1 between facing ends of terminals 4 and 3 is symmetrically disposed about the spacing S3, which is located between coordinates X4 and X5. The parallel faces 12B and 12A of device 1, when mounted to device 2, as shown in FIG. 4, are located at locations X6 and X3, respectively. The respective distances between coordinates X2 and X3 and between X6 and X7 are equal, and the total distance between coordinates X2 and X7 is equal to the sum of lengths L1, L2 and spacing distance S1. The distance L5 between coordinates X3 and X6 is equal to the length of the body 12 along the X axis.

Assuming that the value of R is negligible compared to spacing S1, then should device 1 be mounted to device 2 in either of the two directions associated with the aforedescribed contacting relationships, device 1 occupies the same space coordinates X2, X3, X6, X7. More specifically, as shown in FIG. 5, when device 1 is mounted to device 2, the remote ends of terminals 3 and 4 are located at locations X2 and X7, respectively, and faces 12A and 12B are at locations X3 and X4. It should be understood that in certain applications because of tolerances and packaging requirements, it is important that the device 1 be located in certain spatial coordinates with respect to device 2 for either of the two directions associated with the aforedescribed contacting relationships. As shown in FIG. 5, spacing S1 is now positioned over terminal 5, i.e. away from spacing S3 and terminal 3 now is in contacting relationship with both terminals 5 and 6.

Figure 6:
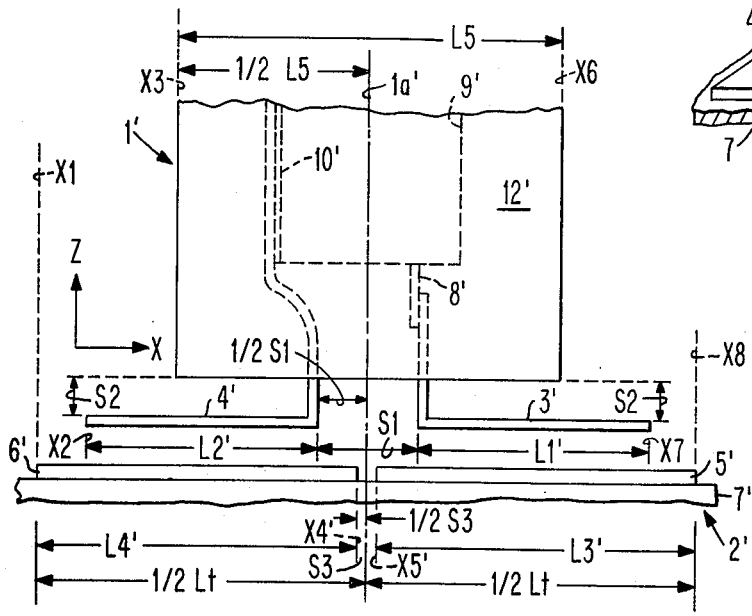
FIG. 6 is an exploded partial front elevation view of a known apparatus of the prior art.

Referring now to the exploded view of FIG. 6, there is shown a prior art polarized tantalum capacitor device 1' which is mountable to a printed circuit board device 2'. Device 1' includes a tantalum electrolytic member 9' which has a rectangular cross-section that is parallel to the XY plane and a central axis 1a. Anode wire lead 8' extends into member 9' and is offset from the central axis 1a' of device 1. A cathode conductive layer 10' is formed on an outer face of member 9'. Terminals 3' and 4' are bonded to lead 8' and layer 10', respectively. Terminals 3' and 4 are formed from plate or flat like members which are shaped so that they are in parallel aligned relationship with each other across spacing S1 and are symmetrically disposed about the center axis 1a. A solid epoxy insulation block 12' encapsulates members 8' − , and a portion of the terminals 3' and 4'. The block 12' has a rectangular cross-section in the XY plane that is compatibly contoured and concentric with the XY rectangular cross-section of member 9'. The terminals 3', 4' have elongated horizontal portions which have equal lengths L1', L2', respectively.

Device 2' has a pair of rectangular terminals 5' and 6' disposed on the printed circuit substrate 7'. The terminals 5', 6' have equal lengths L3', L4' and are spaced a distance S3.

By way of comparison, the printed circuit board devices 2 and 2' of the embodiment of FIGS. 4 and 5 and the prior art apparatus of FIG. 6, respectively, are assumed to have identical counterpart X location coordinates X1, X2, X3, X6, X7, X8. That is to say, in FIGS. 4 –6, all the X1 coordinates are at the same location, etc. Accordingly, in FIGS. 4–6, the distance between their respective coordinates X1 and X8 are equal, the distances between their respective coodinates X2 and X7 are equal, and the distances between their respective coordinates X3 and X6 are equal. In FIG. 6, coordinates X4' and X5' of device 2', which are the locations of the facing sides of terminals 6' and 5', respectively, however, are not the same coordinates at X4 and X5 of device 2 of FIGS. 4 and 5, although the respective distances between X3' and X4' and between X3 and X4 are equal. In FIG. 6, coordinates X3' and X4' are symmetrically disposed about the midpoint or center located between coordinates X1 and X8. The latter coordinates X1, X8 of FIG. 6 are separated by a distance which is equal to the sum of equal lengths L3', L4' and spacing distance S3. The distance between coordinates X2 and X7 is equal to the sum of equal lengths L1', L2' and distance S1. Thus, for the same corresponding parameters S1, S3 and L5, which is the X dimension of the block 12 or 12', device 1' is mountable to device 2' occupying the same X locations X2, X3, X6, X7 as device 1 can occupy with respect to device 2, when mounted thereto in either direction.

Normally, the device 1' is adapted to be mounted with its terminals 3' and 4' connected to terminals 5' and 6', respectively, as shown in FIG. 6, so as to affect the correct polarity to the electrodes 8', 10' when the assembled devices 1', 2' are later installed in a system to which it is to be utilized. However, because of the symmetry of the device 1', and/or the undistinguishable external geometric characteristics of its terminals 3', 4', it is more susceptible to being inadvertently mounted in the reverse direction to device 2', the device 1' occupying the same X location coordinates X2, X3, X6, X7 in either mounting direction. As a result of an incorrect mounting, the terminals 3' and 4' would be connected to terminals 6' and 5', respectively. Hence, when the assembled devices 1', 2', are subsequently connected into the system, an incorrect polarity would be effected across device 1' causing operational failure of the device 1' and/or the system or some subpart thereof, as well as causing a potential partial or complete destruction of the device 1' and/or device 2' and/or system. Thus, the prior art tantalum capacitor device 1' when connected inadvertently in the reverse direction, that is to say, terminal 3' connected to terminal 6' and terminal 4' connected to terminal 5', would have a reverse polarity applied to its electrodes 8' and 10', i.e. positive potential on its cathode and a negative potential on its anode. As a result, the prior art tantalum capacitor device 1' was a potential fire hazard when it was inadvertently connected in the reverse direction.

Moreover, the formation of the terminal 4, cf. FIG. 2, of the preferred embodiment is much more simplified than the formation of the terminal 4' of the prior art device of FIG. 6. In the prior art device 1', terminal 4' requires substantial shaping in at least three places to effect its symmetrical disposition with terminal 3' about the central axis 1a'. On the other hand, in the preferred embodiment, only minimal shaping is required of the terminal 4 of device 1 and the shaping is substantially limited to the respective right angle bend between the parts 4H and 4V, and/or only slightly bending the vertical part 4V to obtain the desired offset relationship with respect to axis 1a. This is particularly advantageous when the terminals 3 and 4 are to be formed with extremely small dimensions. Moreover, in the preferred embodiment, since the external portions of terminals 3 and 4 have different offset relationships from the axis 1a of symmetry of device 1 and/or different lengths L1, L2, they provide a reference point or points from which are benchmarked the assembly orientation of devices 1 and 2 and/or the marking of pole identifying indicia to the device 1 such as the bevel surface 14 provided on the anode side of block 12. Because the terminals 3', 4' of device 1' have equal dimensions L1', L2' and/or are externally symmetrical with respect to the axis 1a' of symmetry of device 1', the prior art device 1' is subject to being misoriented in assembly and/or incorrectly polarity marked.

In accordance with the principles of the present invention, there is also provided a method for protecting electrical apparatus which has a pair of first and second interconnecting terminals, e.g. terminals 5, 6 of device 2, and at least one polarized component, e.g. device 1, with positive and negative terminals, e.g. terminals 3 and 4, respectively. The method comprises the steps of electrically connecting the positive and negative terminals 3 and 4 to the first and second interconnection terminals 5 and 6, respectively, whenever the component 1 is oriented in a first direction, cf. FIG. 4, and electrically connecting at least one, e.g. terminal 3, of the positive and negative terminals 3, 4 to both the first and second interconnection terminals 5 and 6 whenever the component 1 is oriented in a second direction, cf. FIG. 5. In the first direction, the apparatus is protected because the component 1 is properly polarized when the assembled devices 1, 2 are subsequently installed in the system in which the devices 1, 2 are to be utilized. In the second direction, the terminal, e.g. terminal 3, of the component 1 will provide a short circuit connection between terminals 5 and 6 and thereby cause the component 1 to be electrically bypassed.

As is apparent to those skilled in the art, that while the invention has particular application for the interconnection of a polarized device, it may be used for interconnecting non-polarized devices as well in other applications where it is desired to provide a desired electrical polarity to a specific terminal of a non-polarized device. Moreover, as is apparent to those skilled in the art, terminal 4 can be modified to act as the bypass terminal in lieu of terminal 3, or both terminals 3, 4 may be modified to act as bypass terminals when the device 1 is mounted in the reverse direction. Moreover, in lieu of placing the bypass terminal or terminals on the polarized device it or they may be located on the other device to which the polarized device is to be mounted.

Thus, while the invention has been particularly shown and described with reference to a preferred embodiment thereof, it will be understood by those skilled in the art that various changes in form and details may be made therein without departing from the spirit and scope of the invention.

I claim:

1. Electrical apparatus comprising in combination:
  a first electrical device,
  first and second terminal means disposed on said first device,
  a second electrical device, and
  third and fourth terminal means disposed on said second device,
  said first and second terminal means being adapted to be in contacting relationship with said third and fourth terminal means, respectively, whenever said first device is oriented in a predetermined first direction relative to said second device, and said first terminal means being adapted to be in contacting relationship with said third and fourth terminal means whenever said first device is oriented in a predetermined second direction relative to said second device, and said first electrical device being a polarized electrical component.

2. Electrical apparatus according to claim 1 wherein said polarized electrical component is a tantalum capacitor.

3. Electrical apparatus comprising in combination:
  at least one electrical component having body means,
  first and second terminal means disposed on said body means, and
  circuit interconnection third and fourth terminal means for interconnecting said component to predetermined circuit apparatus,
  said first and second terminal means being adapted to be in contacting relationship with said third and fourth terminal means, respectively, whenever said body means is oriented in a first direction with respect to said third and fourth terminal means, and said first terminal means being adapted to be in contacting relationship with said third and fourth terminal means whenever said body means is oriented in a predetermined second direction with respect to said third and fourth terminal means, and said electrical component being of the polarized type.

4. Electrical apparatus according to claim 3 wherein said polarized electrical component is a polarized tantalum capacitor having cathode and anode electrodes.

5. Electrical apparatus according to claim 4 wherein said anode electrode is connected to said first terminal means and said cathode electrode is connected to said second terminal means, and said third and fourth terminal means are adapted to have applied thereto positive and negative electrical polarities, respectively.

6. Electrical apparatus comprising:
a polarized capacitor having a predetermined axis of symmetry and anode and cathode electrodes, respectively,
an L-shaped first terminal connected to said anode electrode and disposed at a predetermined first location with respect to said axis,
an L-shaped second terminal connected to said cathode electrode and disposed at a predetermined second location with respect to said axis, said second location being farther remote from said axis than said first location, and
a printed circuit board having at least two first and second printed circuit terminals, said first and second printed circuit terminals being adapted to have applied thereto positive and negative electrical polarities, respectively,
said first and second L-shaped terminals being in contacting relationships with said first and second printed circuit terminals, respectively, whenever said capacitor is oriented in a first direction with respect to said printed circuit board, and said first L-shaped terminal being in contacting relationship with both said first and second printed circuit terminals whenever said capacitor is oriented in an opposite second direction with respect to said printed circuit board.

7. Electrical apparatus according to claim 6 wherein said capacitor is of the tantalum type.

8. The method of protecting electrical apparatus having a pair of first and second interconnecting terminals and at least one polarized component with positive and negative terminals, said method comprising the steps of:
electrically connecting said positive and negative terminals to said first and second interconnection terminals, respectively, whenever said component is oriented in a first direction, and
electrically connecting at least one of said positive and negative terminals to both said first and second interconnection terminals whenever said component is oriented in a second direction.

9. The method according to claim 8 wherein said polarized component is a polarized tantalum capacitor.

10. Circuit package apparatus for mounting a polarized electrical element at a particular first position on a printed circuit board, said element having first and second ends and a center therebetween, said apparatus comprising:
a first L-shaped lead extending from a second position between said center of said element and said first end,
a second L-shaped lead extending from a third position between said first lead and said first end; and
two printed circuit lines disposed on said board and having a gap located between said first and second leads when said element is in said particular first position,
whereby said first and second leads respectively contact said two printed circuit lines when said element is mounted to said board at said first position in a first direction, and said first lead causes an electrical short connection between said two printed circuit lines when said element is mounted to said board at said first position in the reverse direction.

11. Apparatus according to claim 10 wherein said element is a polarized tantalum capacitor.

* * * * *